(12) United States Patent
Cheng et al.

(10) Patent No.: US 8,383,474 B2
(45) Date of Patent: Feb. 26, 2013

(54) THIN CHANNEL DEVICE AND FABRICATION METHOD WITH A REVERSE EMBEDDED STRESSOR

(75) Inventors: Kangguo Cheng, Albany, NY (US); Bruce B. Doris, Albany, NY (US); Ali Khakifirooz, Albany, NY (US); Pranita Kulkarni, Albany, NY (US); Ghavam G. Shahidi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 12/789,699

(22) Filed: May 28, 2010

(65) Prior Publication Data
US 2011/0291189 A1 Dec. 1, 2011

(51) Int. Cl.
*H01L 21/8238* (2006.01)
(52) U.S. Cl. ........................................ 438/199
(58) Field of Classification Search ............... 438/199
See application file for complete search history.

(56) References Cited

U.S. PATENT DOCUMENTS

| | | | |
|---|---|---|---|
| 5,967,794 A | 10/1999 | Kodama | |
| 6,087,235 A | 7/2000 | Yu | |
| 7,528,056 B2 | 5/2009 | Ieong et al. | |
| 2006/0160292 A1* | 7/2006 | Anderson et al. | 438/199 |
| 2007/0029617 A1* | 2/2007 | Kato | 257/367 |
| 2007/0228482 A1* | 10/2007 | Wei et al. | 257/369 |
| 2009/0242990 A1* | 10/2009 | Saitoh et al. | 257/351 |

OTHER PUBLICATIONS

A. Wei et al. "Multiple Stress Memorization in Advanced SOI CMOS Technologies", Symp. VLSI Tech, 2007, pp. 216-217.
R. A. Donaton, et al., Design and fabrication of MOSFETs with a reverse embedded SiGe (Rev. e-SiGe) structure, IEDM Tech. Dig., 2006.
K. Yako et al. "Aggressive Design of Millisecond Annealing Junctions for Near-Scaling-Limit Bulk CMOS Using Raised Source/Drain Extensions," IEDM Tech. Dig., 2008.

* cited by examiner

*Primary Examiner* — Charles Garber
*Assistant Examiner* — Andre' C Stevenson
(74) *Attorney, Agent, or Firm* — Tutunjian & Bitetto, P.C.; Louis Percello

(57) ABSTRACT

A device and method for inducing stress in a semiconductor layer includes providing a substrate having a dielectric layer formed between a first semiconductor layer and a second semiconductor layer. A removable buried layer is provided on or in the second semiconductor layer. A gate structure with side spacers is formed on the first semiconductor layer. Recesses are formed down to the removable buried layer in areas for source and drain regions. The removable buried layer is etched away to form an undercut below the dielectric layer below the gate structure. A stressor layer is formed in the undercut, and source and drain regions are formed.

25 Claims, 10 Drawing Sheets

THIN CHANNEL DEVICE AND FABRICATION METHOD WITH A REVERSE EMBEDDED STRESSOR

BACKGROUND

1. Technical Field

The present invention relates to semiconductor devices and fabrication, and more particularly to a thin channel device and fabrication method that employs an embedded stressor layer.

2. Description of the Related Art

Thin channel metal oxide semiconductor field effect transistors (MOSFETs), such as ultrathin body semiconductor-on-insulators (SOI), FinFETs, trigates, or nanowire structures may be candidates for device scaling in 22 nm node and beyond. However, embedded stressors, such as SiGe or Si:C, which are usually employed in bulk and partially depleted (PD) SOI technologies to improve device performance cannot be used with thin channel structures. An embedded stressor structure for bulk devices, is not suitable for thin-channel devices because the total channel thickness is limited to control electrostatic integrity of the device. Present embedded stressors cannot be used with a thin-channel MOSFET structure since a total semiconductor thickness is limited among other things.

SUMMARY

A device and method for inducing stress in a semiconductor layer includes providing a substrate having a dielectric layer formed between a first semiconductor layer and a second semiconductor layer. A removable buried layer is provided on or in the second semiconductor layer. A gate structure with side spacers is formed on the first semiconductor layer. Recesses are formed down to the removable buried layer in areas for source and drain regions. The removable buried layer is etched away to form an undercut below the dielectric layer below the gate structure. A stressor layer is formed in the undercut, and source and drain regions are formed.

A semiconductor device includes a substrate having a dielectric layer formed between a first semiconductor layer and a second semiconductor layer. A gate structure with side spacers is formed on the first semiconductor layer, and recesses are formed below areas for source and drain regions. The recesses are filled with a filler material (e.g., an undoped material or a material that has opposite doping polarity of that of the source and drain). The source and drain regions are formed on the filler material (e.g., the undoped or doped with the opposite polarity material) in the recesses. A stressor layer is formed between the recesses and below the dielectric layer in an undercut formed by removing a portion of the second semiconductor layer. The stressor layer provides stress to the first semiconductor layer where a device channel is formed.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, a device structure for thin-channel devices, such as thin-channel metal oxide semiconductor field effect transistors (MOSFETs), includes a reverse embedded stressor under a thin buried oxide. In addition, a method to fabricate this structure is disclosed. Advantageously, device electrostatics are controlled by channel thickness, while channel stress is provided from the buried reverse embedded stressor.

It is to be understood that the present invention will be described in terms of a given illustrative architecture; however, other architectures, structures, substrate materials and process features and steps may be varied within the scope of the present invention.

A circuit formed from the devices as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1:
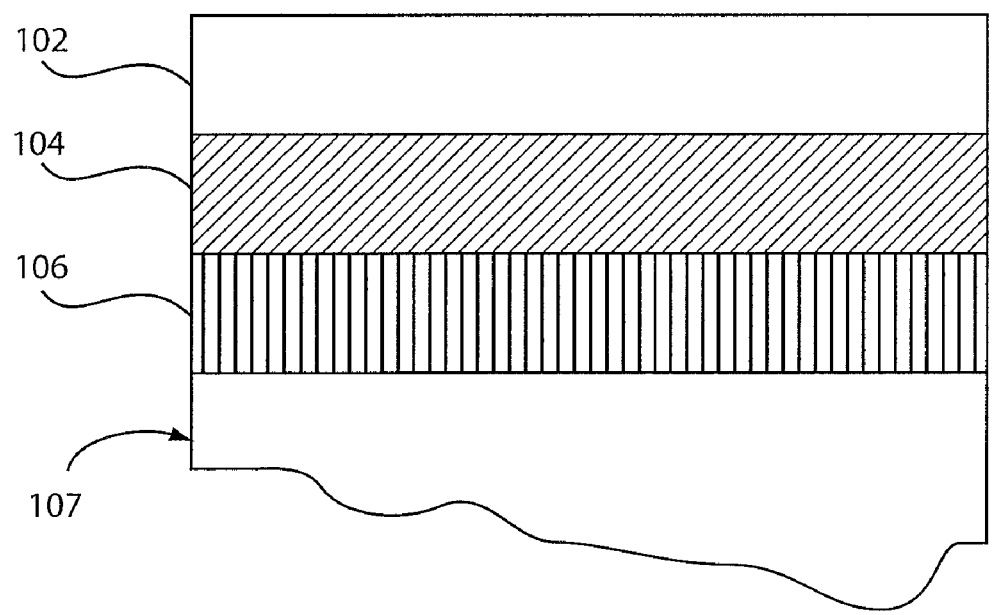
FIG. 1 is a cross-sectional view of a semiconductor substrate having a buried amorphized layer in accordance with one embodiment.

Referring now to the drawings in which like numerals represent the same or similar elements and initially to FIG. 1, a structure 100 includes a channel layer 102, preferably a thin channel layer for forming a thin-channel device. Structure 100 may be a thin semiconductor-on-insulator (SOI) or includes a bulk substrate that may include Gallium Arsenide, monocrystalline silicon, Germanium, or any other material or combination of materials where the present principles may be applied. In some embodiments, the structure 100 further comprises other features or structures that are formed on or in the semiconductor substrate in previous process steps.

In one embodiment, the channel layer 102 is formed on or joined to a thin buried insulator 104 (e.g., thickness 10-50 nm), such as e.g., a buried oxide (BOX). A base layer or substrate 107 preferably includes a semiconductor layer, which may include Gallium Arsenide, monocrystalline silicon, Germanium, or any other material or combination of materials. Device isolation (e.g., shallow trench isolation (STI) (not shown) may be formed to separate devices. The substrate 107 is processed to form a buried removable layer 106. The buried layer 106 may be formed under the buried insulator 104 by implanting heavy ions such as Ge, Si or Xe into the substrate 107. The energy and dose of ion implant is chosen in a way that minimum damage is introduced in a channel area of channel layer 102. The selection of the energy and dose may be determined by known methods.

In an alternate embodiment, the removable layer 106 is formed with substrate 107 or deposited on substrate 107. In one embodiment, layer 106 is an n-type doped Si layer that can be removed selectively with respect to the silicon (e.g., of substrate 107) or silicon dioxide (BOX) layer (e.g., layer 104). In one embodiment, the removable layer 106 includes a material that can be formed after the substrate 107 is formed or as a part of the substrate formation and has the property of being removed selectively with respect to a handle wafer (107) and the buried insulator layer 104. For example, SiN or SiGe may be used in building the SOI substrate and can be selectively removed as stated above.

Figure 2:
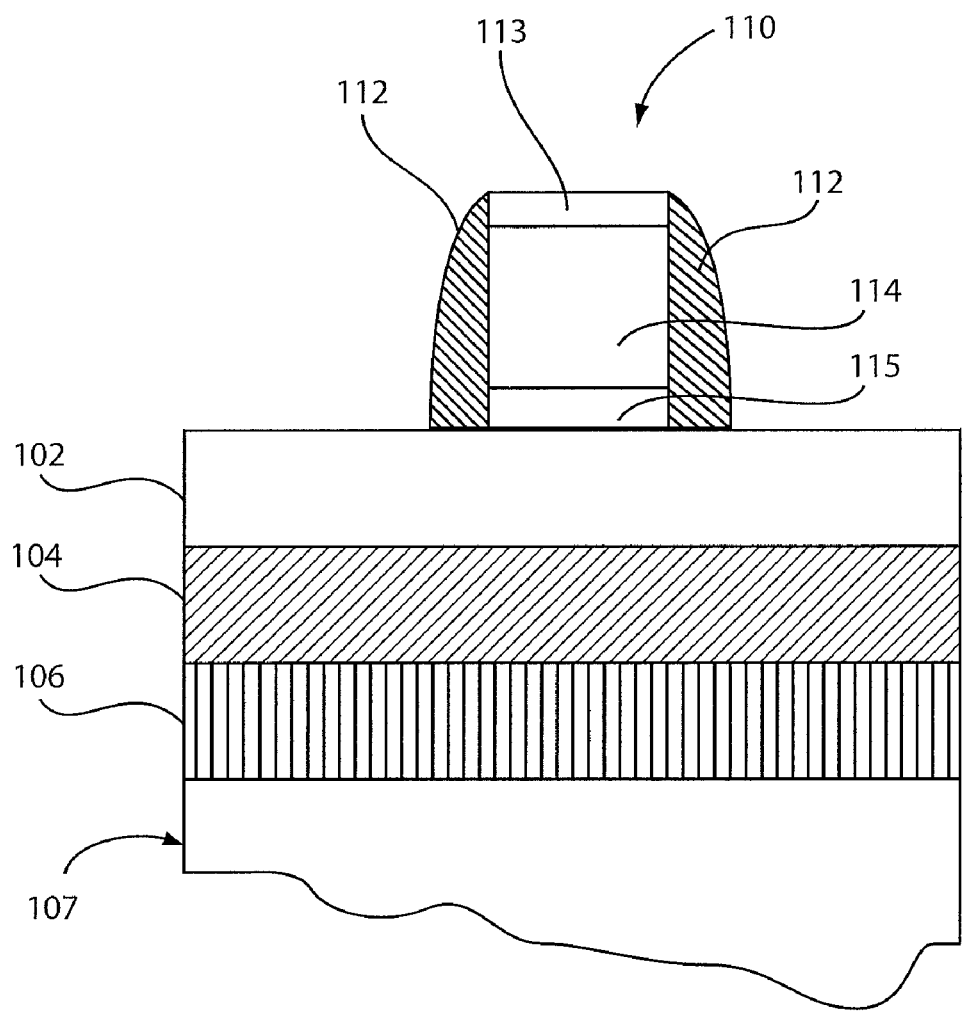
FIG. 2 is a cross-sectional view of the substrate of FIG. 1 having a gate structure formed on the substrate in accordance with one embodiment.

Referring to FIG. 2, conventional device processing is employed to form a gate structure 110. The gate structure 110 is preferably fabricated with an integral hardmask or gate cap 113 to facilitate the silicon recess process as will be described below. The gate cap 113 may include silicon nitride. The gate structure 110 includes a gate conductor 114 and a gate dielectric 115, spacers 112 and Source/Drain (S/D) extension doping in channel layer 102. The S/D extension doping occurs on opposite sides of the gate structure 110 and extends to areas below the gate structure 110.

Figure 3:
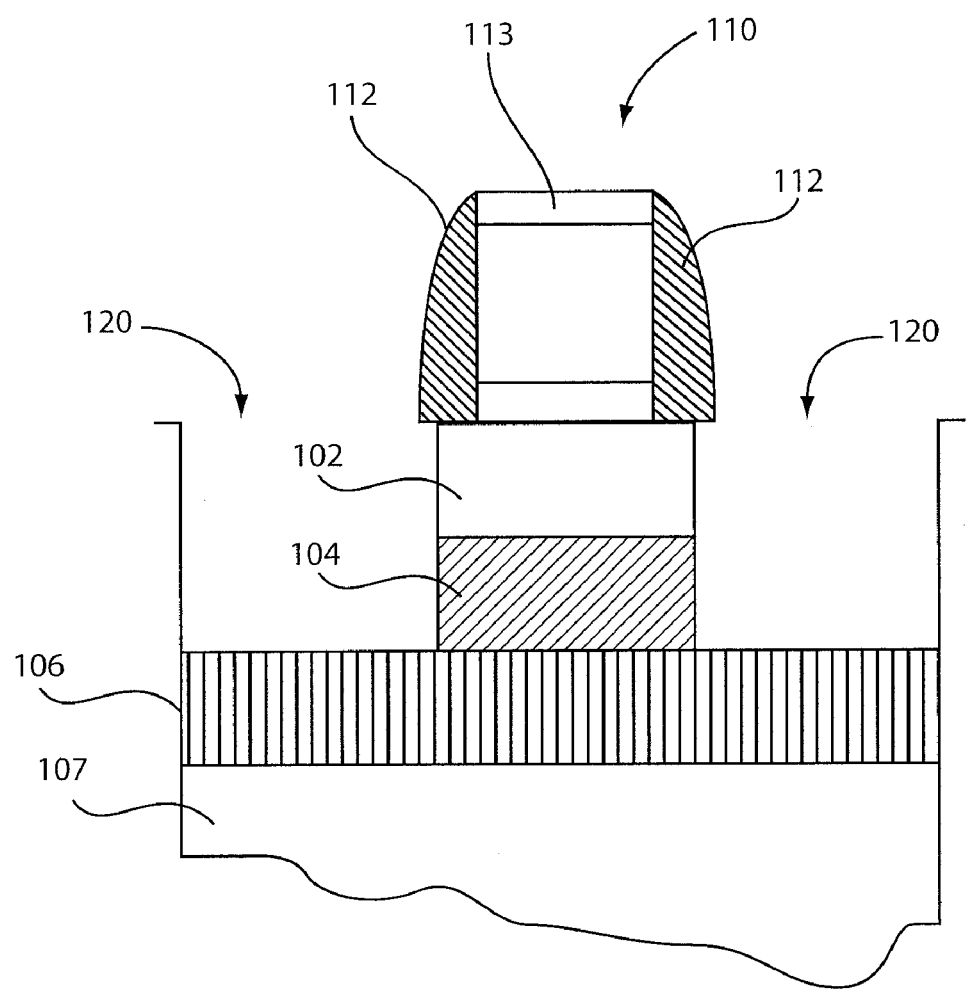
FIG. 3 is a cross-sectional view of the substrate of FIG. 2 having recesses formed adjacent to the gate structure down to the amorphous layer in accordance with one embodiment.

Referring to FIG. 3, a masking layer (not shown) may be employed if the hard mask 113 is not used. The masking layer would be formed and patterned to open up holes over areas adjacent to the gate structure 110. Recesses 120 are etched in S/D regions through the top semiconductor layer or channel layer 102 and buried insulator 104 by methods such as reactive ion etching (RIE) or other anisotropic etching processes. In one embodiment, layers 102 and 104 are over etched such that an edge of the layers 102 and 104 is below spacers 112. In addition, it is preferable that the recesses 120 extend to a depth just below a top of the amorphous portion of layer 106.

Figure 4:
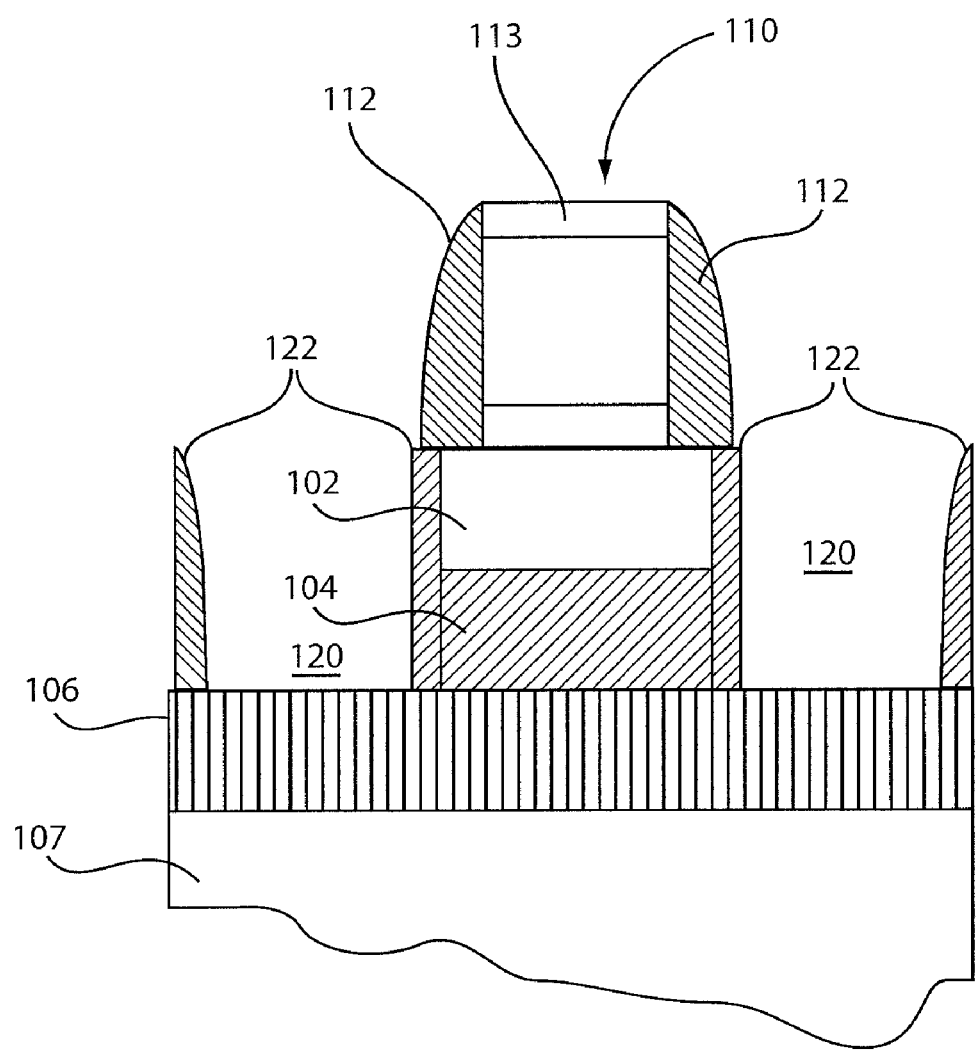
FIG. 4 is a cross-sectional view of the substrate of FIG. 3 having spacers formed on sidewalls of the recesses in accordance with one embodiment.

Referring to FIG. 4, spacers 122 are formed on sidewalls of the recess 120. The spacers 122 are formed to protect the buried insulator 104 and the channel layer 102. Spacers 122 may include a silicon nitride, silicon dioxide or equivalent. The spacers 122 will be employed to protect surfaces during subsequent etching. An etch is performed to remove the amorphized layer (or the other materials (e.g., SiN, SiGe, etc. in other embodiments) 106, which is now exposed at the bottom of the recesses 120.

Figure 5:
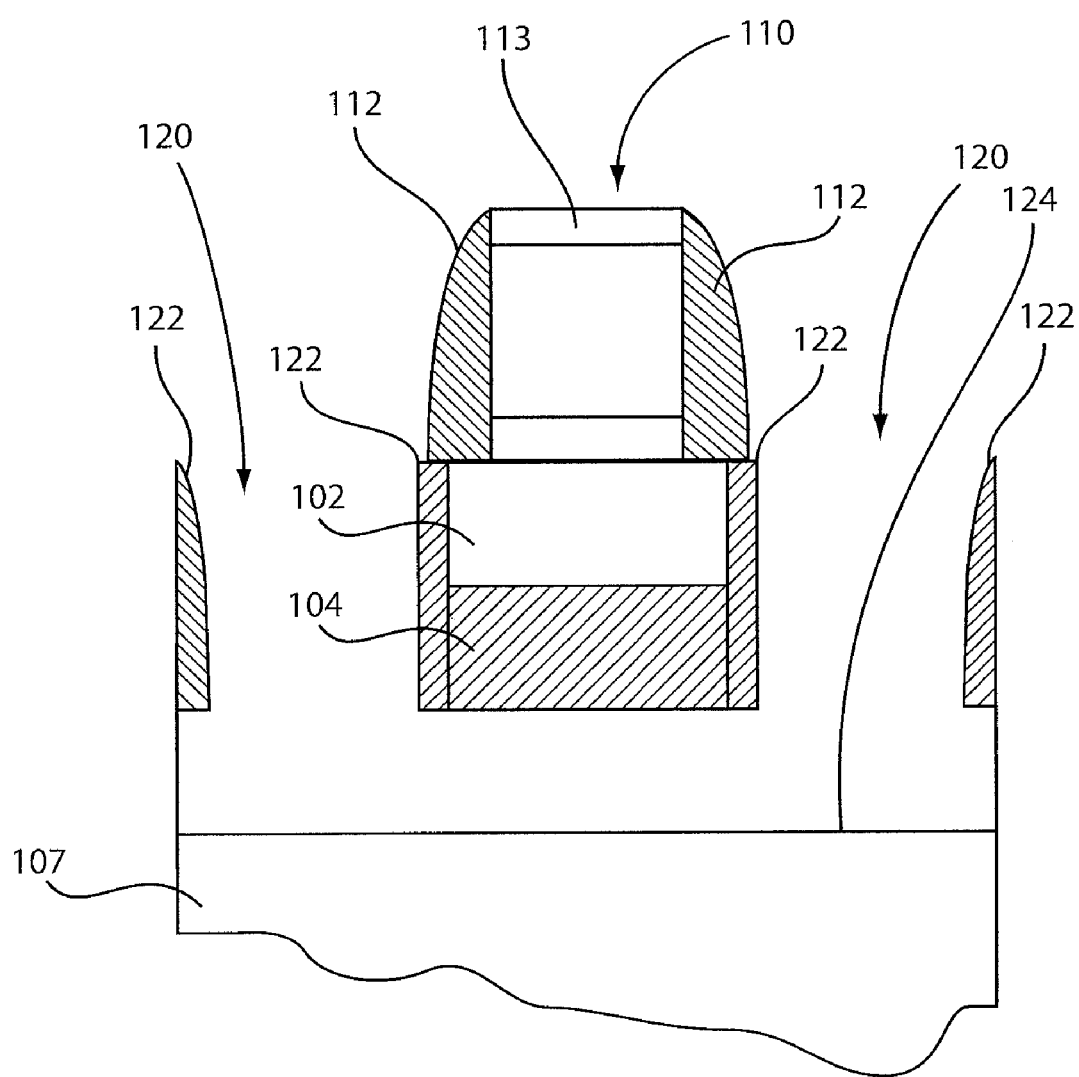
FIG. 5 is a cross-sectional view of the substrate of FIG. 4 having the amorphous layer removed to form an undercut in accordance with one embodiment.

Referring to FIG. 5, the amorphized layer or other material 106 is removed by etching. A plurality of dry or wet etches may be employed to remove the amorphous layer 106 (e.g., amorphized silicon or compound including silicon) without attacking the insulators 104, 122 or the semiconductor layer (107) (e.g., c-Si) below. The removal of the amorphous layer 106 exposes a surface 124 of the substrate 107. Since the device extends into the page, the gate structure 110, buried insulator 104 and channel layer 102 are connected at end portions to permit and hollowing out under the device (e.g., under the buried layer 104).

Figure 6:
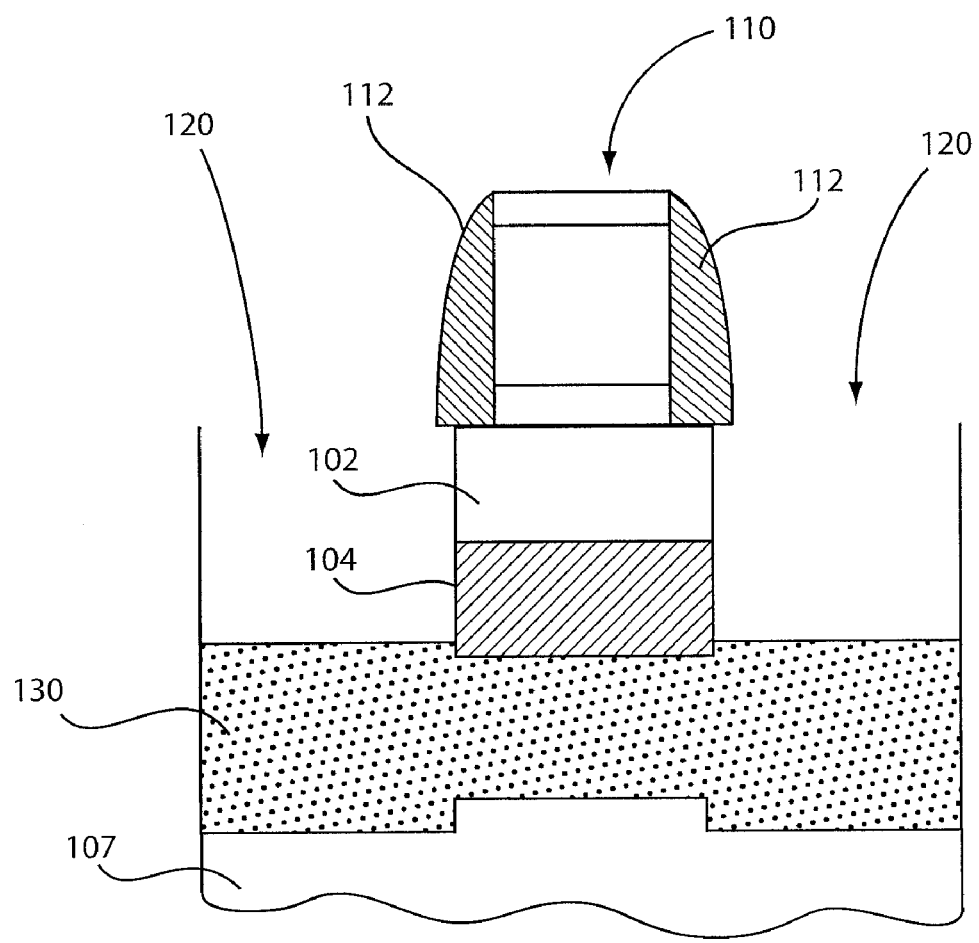
FIG. 6 is a cross-sectional view of the substrate of FIG. 5 having a stressor layer formed in the undercut and in a portion of the recesses in accordance with one embodiment.

Referring to FIG. 6, the spacers 122 are removed from the recess 120 sidewalls. The spacers 122 may be removed by a wet or dry etch. Spacers 112 are preferably protected from this etch, although spacers 112 may be formed to have a thickness sufficient to remain after the etch, even if unprotected. A reverse embedded stressor 130 is grown epitaxially in the recess 120 and undercut region (below layer 104). Materials for n-type field effect transistors (NFETs) and p-type field effect transistors (PFETs) may include SiGe and Si:C, respectively, for stressor 130.

Figure 7:
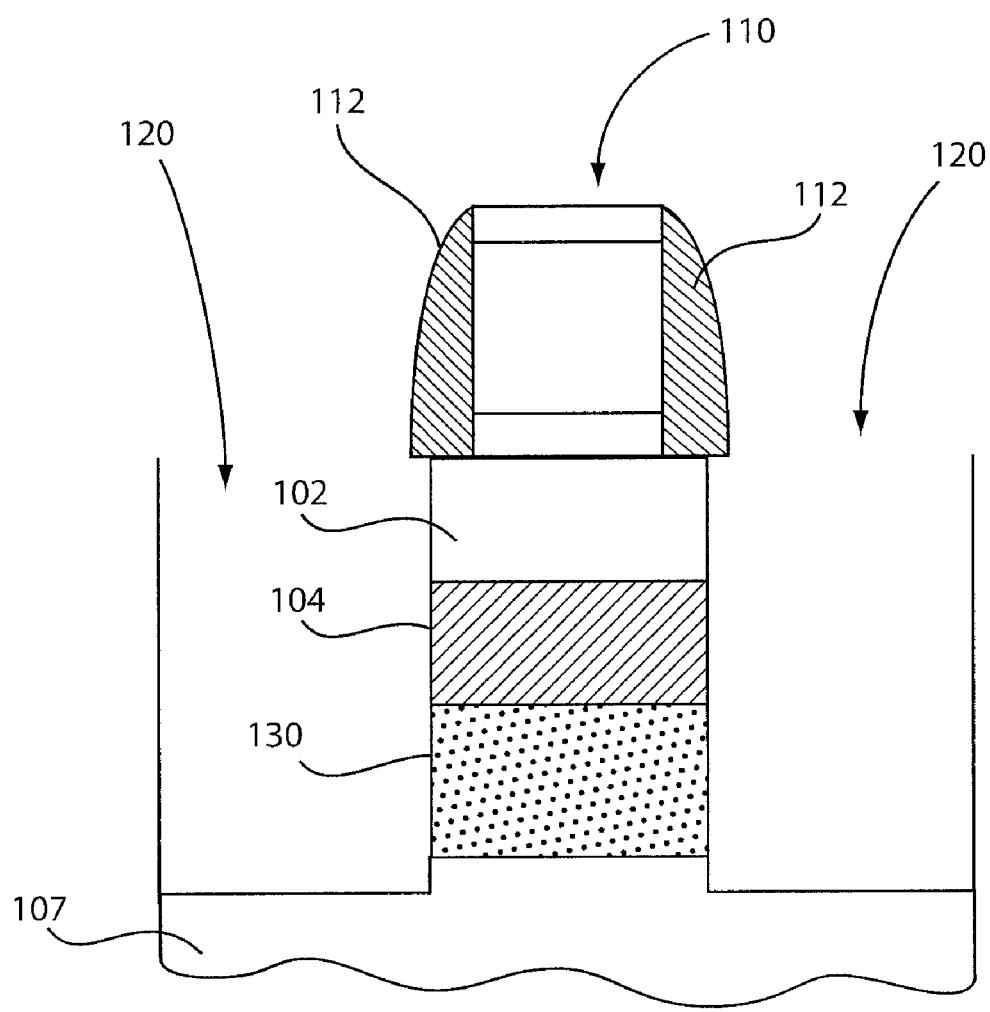
FIG. 7 is a cross-sectional view of the substrate of FIG. 6 having the stressor layer removed from the portion of the recesses in accordance with one embodiment.

Referring to FIG. 7, an etch step (e.g., RIE) is performed to etch the reverse embedded stressor 130 in the S/D regions (e.g., from within the recesses 120). Any stress at the top of the reverse stressor layer 130 is relaxed, so that this layer 130 exerts stress on the channel layer 102 and therefore the channel of the device through the thin buried insulator 104.

Figure 8:
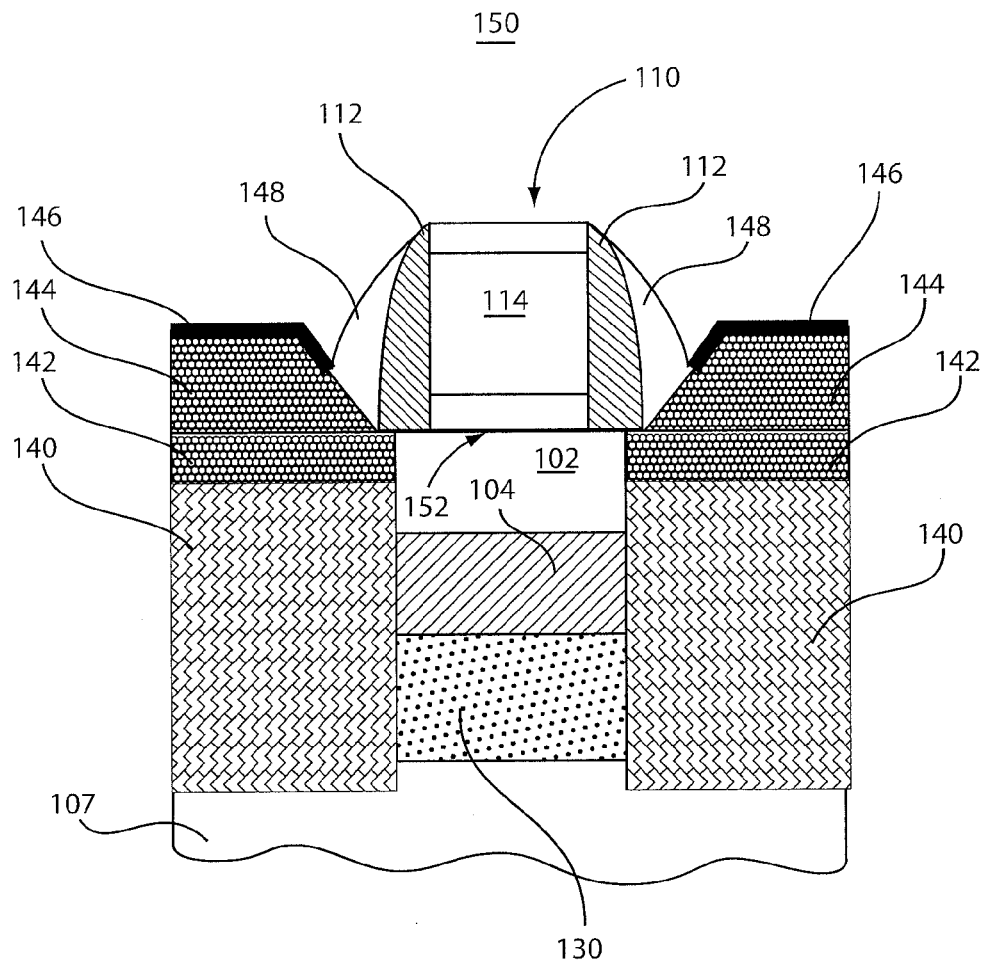
FIG. 8 is a cross-sectional view of a semiconductor device in accordance with the present principles.

Referring to FIG. 8, recesses 120 (FIG. 7) are filled with a filler material 140 (e.g., an undoped material or a doped material that has opposite doping polarity of the source/drain). Silicon, SiGe, Si:C or other suitable materials may be employed for filler material 140 depending on the polarity of the device and the application. The filling of the recesses 120 is preferably performed using an epitaxial growth process. The material 140 may be followed by a doped material 142, which may also be formed using epitaxy. The doped material 142 may be doped in-situ during formation. Doping may also be performed after the formation of material 142. Raised S/D regions 144 are formed on material 142. Raised regions 144 may be epitaxially grown and doped in-situ or by a separate doping process after the raised regions 144 are formed.

Spacers 148 are formed, e.g., using silicon nitride or equivalent materials. The raised regions 144 are silicided with the formation of a silicide layer 146 or other suitable material. Optionally, embedded stressors can be used in the S/D region layers 142 or even for raised regions 144. Materials may include, e.g., SiGe for PFETs and Si:C for NFETs.

A device structure 150 as shown in FIG. 9 includes the reverse embedded stressor 130 under a channel 152. The stressor 130 is located under the buried insulator 104, e.g., a buried oxide. Optionally, as stated, embedded stressors can be used in the source/drain regions 142 or 144 as well; instead of or in addition to layer 130.

Figure 9A:
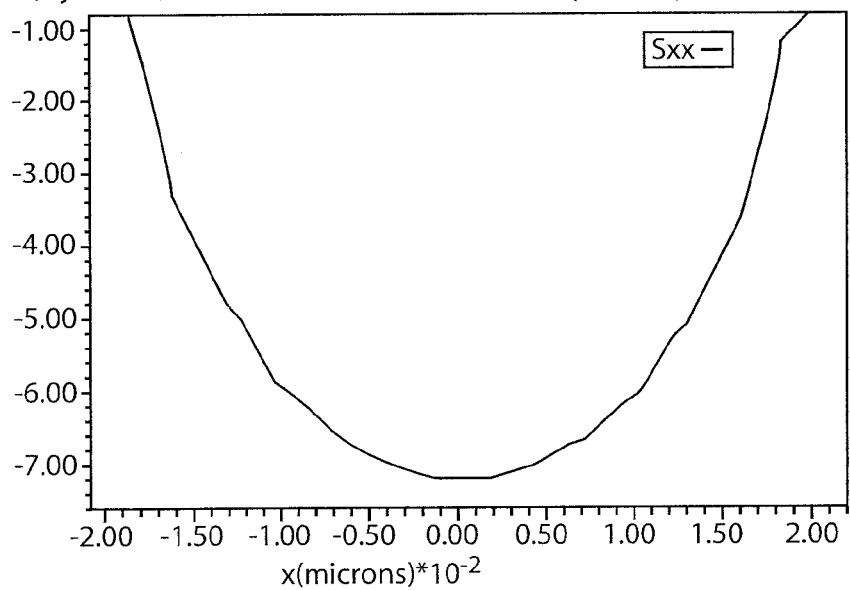
FIGS. 9A, 9B, and 9C show plots of stresses for Sxx, Syy and Szz, respectively of a design in accordance with the present principles.
Figure 9B:
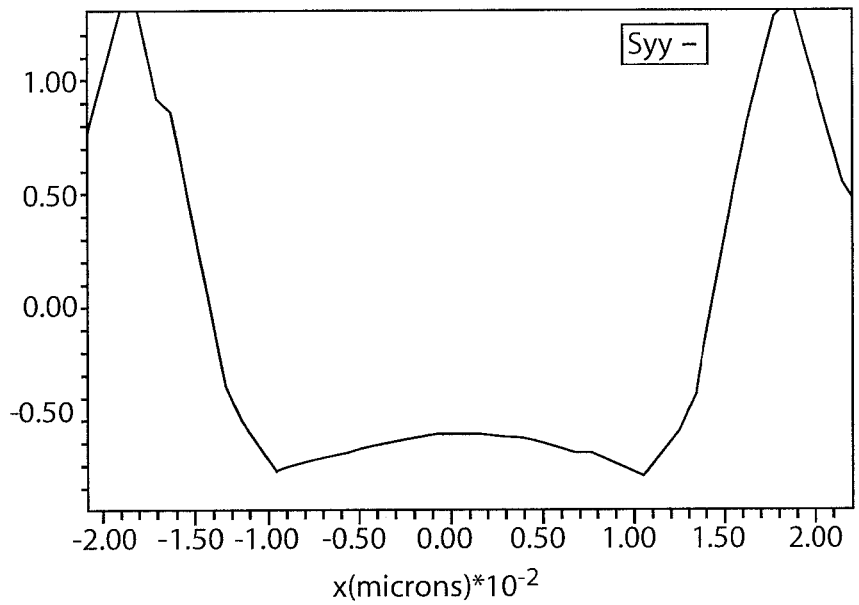
Figure 9C:
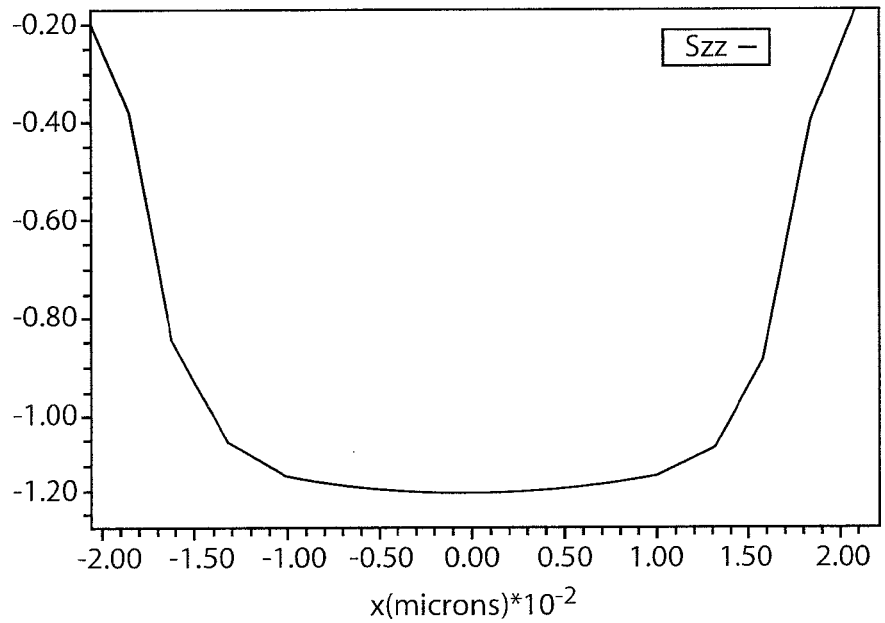

Referring to FIGS. 9A, 9B and 9C, stress profiles are shown for an illustrative design analyzed using a technology computer aided design (TCAD) model in accordance with the present principles. The stress profiles where measured/modeled using the design depicted in FIG. 8. The design included a gate width (width of conductor 114) of 25 nm, a thickness of a channel layer (102) of 6 nm, a thickness of insulator (104) of 20 nm and a thickness of a reverse stressor layer (130) of 20 nm. The reverse stressor layer included SiGe with 25% Ge and provided −1.3 GPa intrinsic stress.

FIGS. 9A, 9B and 9C show the stress levels (Sxx, Syy, Szz) for normal stresses in the x, y and z directions, respectively. Stress in dynes/$cm^2$ (y-axis) is plotted against the x-coordinate (on x-axis) in microns for the channel layer 102 in FIG. 8. The effective stress for this illustrative example is Seff=Sxx−0.4Syy−0.6Szz for the 100 surface of the channel layer (which is monocrystalline silicon in the example). For this computation, Sxx=−700 MPa, Syy=−40 MPa and Szz=−110 MPa. Therefore at the center of the gate (x=0.0), Seff=−610 MPa, resulting in a reverse stressed channel layer. Therefore, channel strain is provided to enhance performance of the thin-channel device in accordance with the present principles. It should be understood that the illustrative example described represents an exemplary embodiment. Other parameters and configurations may be employed in accordance with the present principles as well.

The present principles may be employed with any semiconductor device technology. In particularly useful embodiments, the present principles may be employed with thin channel metal oxide semiconductor field effect transistor (MOSFET) structures such as ultrathin body semiconductor-on-insulator (SOI), FinFETs, trigates, and nanowires, etc.

Figure 10:
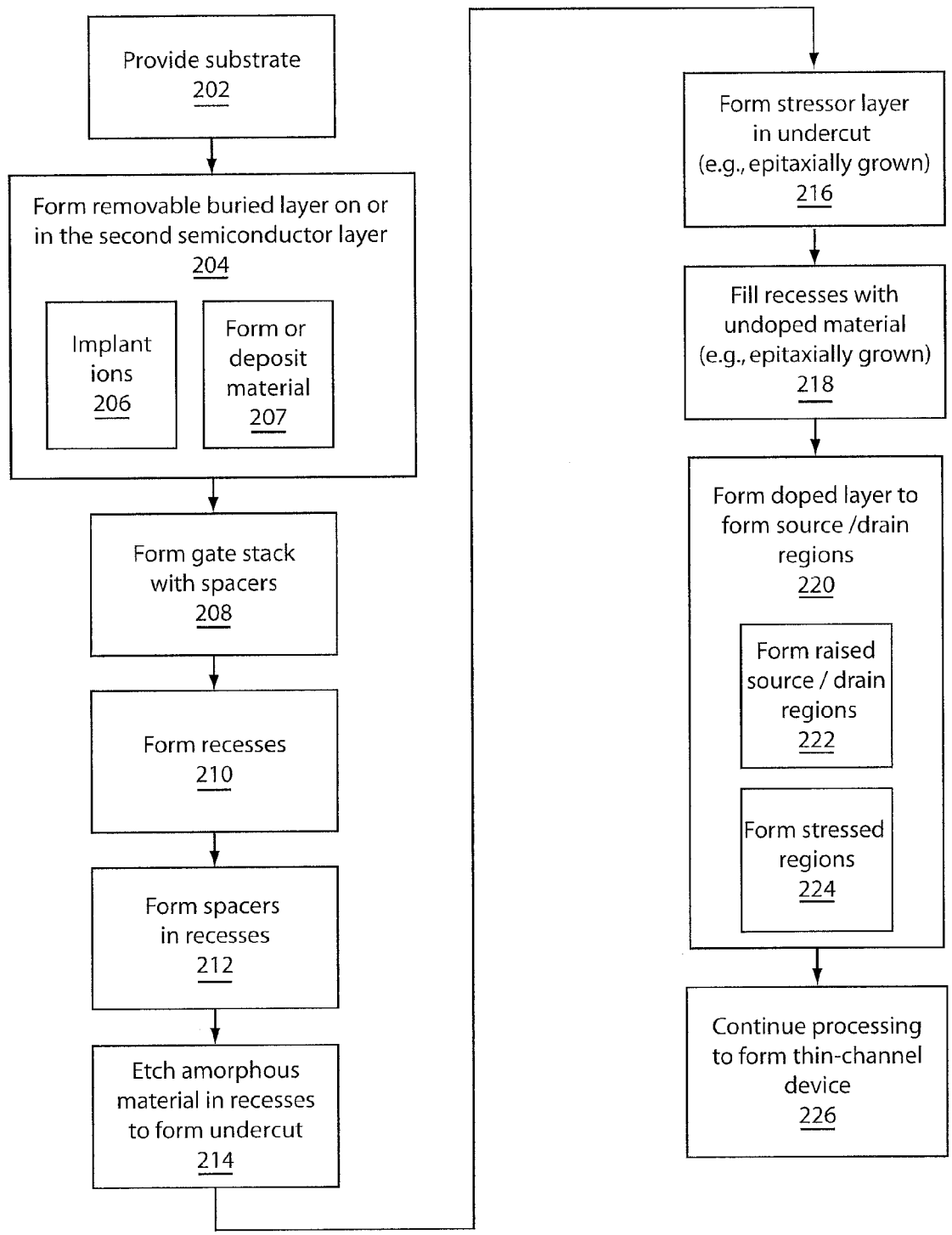
FIG. 10 is a flow diagram showing a method for inducing a stress in a device channel using a buried stress layer in accordance with one illustrative embodiment.

Referring to FIG. 10, a flow diagram shows an illustrative method for inducing stress in a semiconductor layer. In block 202, a semiconductor-on-insulator substrate (or bulk substrate) is provided having a dielectric layer formed between a first semiconductor layer and a second semiconductor layer. In block 204, a removable buried layer is formed on or in the second semiconductor layer. In block 206, the second semiconductor layer is processed to form an amorphized material. This may include implanting ions in the second semiconductor layer (e.g., through the first semiconductor layer and the buried dielectric layer) to form the amorphized material. The implanting may include implanting at least one of Ge, Si and Xe, or other suitable ions. In block 207, alternately, the removable buried layer is a selectively removable layer formed on or in the second semiconductor layer. The selectively removable layer may include, e.g., SiGe, SiN, etc., and is deposited on or formed with the second semiconductor layer.

In block 208, a gate structure with side spacers is formed on the first semiconductor layer. In block 210, recesses are formed down to the removable layer material in areas for source and drain regions. In block 212, sidewall spacers may be formed on sidewalls of the recesses to protect the sidewalls from subsequent etching. In block 214, the removable buried layer is etched to form an undercut below the dielectric layer below the gate structure. In block 216, a stressor layer is formed or grown (e.g., epitaxially grown) on a surface of the second semiconductor layer in the undercut.

In block 218, the recesses are filled with a filler material. This may include epitaxially growing the filler material in the recesses. In block 220, a doped layer is deposited on the filler material to form source and drain regions in the areas for source and drain regions. The doped layer may include raised source/drain regions in block 222. The doped layer may also include stress which is induced to the first semiconductor layer (and therefore, the channel) in block 224. In one embodiment, depositing a doped layer on the filler material includes epitaxially growing the doped layer to a top surface of the first semiconductor layer and epitaxially growing doped raised portions for the source and drain regions.

In block 226, processing continues to form a device (e.g., a thin-channel device) having a channel in the first semiconductor layer, wherein stress of the stressor layer provides stress in the channel.

Having described preferred embodiments of a thin channel device and fabrication method with a reverse embedded stressor (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for inducing stress in a semiconductor layer, comprising: providing a substrate comprising a first semiconductor layer, a dielectric layer, and a second semiconductor layer, said first semiconductor layer being formed directly on the dielectric lager and said dielectric layer being formed directly on the second semiconductor layer; providing a removable buried layer on or in the second semiconductor layer; forming a gate structure with side spacers on the first semiconductor layer; forming recesses down to the removable buried layer in areas for source and drain regions; etching away the removable buried layer to form an undercut below the dielectric layer below the gate structure; forming a stressor layer in the undercut; and forming source and drain regions in the areas for source and drain regions.

2. The method as recited in claim 1, further comprising forming spacers on sidewalls of the recesses to protect the sidewalls during etching away of the removable buried layer.

3. The method as recited in claim 1, further comprising forming a device having a channel in the first semiconductor layer, wherein stress of the stressor layer provides stress in the channel.

4. The method as recited in claim 1, wherein providing the removable buried layer includes implanting ions in the second semiconductor layer to form an amorphized material for the removable buried layer.

5. The method as recited in claim 4, wherein implanting ions includes implanting at least one of Ge, Si and Xe.

6. The method as recited in claim 1, wherein the stressor layer is epitaxially grown.

7. The method as recited in claim 1, wherein forming source and drain regions in the areas for source and drain regions includes:

filling the recesses with a filler material; and depositing a doped layer on the filler material.

8. The method as recited in claim 7, wherein the doped layer includes raised source/drain regions.

9. The method as recited in claim 7, wherein at least one of the filler material and the doped layer includes stress which is induced to the first semiconductor layer.

10. The method as recited in claim 1, wherein providing the removable buried layer includes forming a selectively removable material on or in the second semiconductor layer to form the removable buried layer.

11. The method as recited in claim 1, wherein the selectively removable material includes at least one of SiN and SiGe.

12. A method for inducing stress in a semiconductor layer, comprising:
    providing a substrate comprising a first semiconductor layer, a dielectric layer, and a second semiconductor layer, said first semiconductor layer being formed directly on the dielectric layer and said dielectric layer being formed directly on the second semiconductor layer;
    processing the second semiconductor layer to form an amorphized material;
    forming a gate structure with side spacers on the first semiconductor layer;
    forming recesses down to the amorphized material in areas for source and drain regions;
    forming sidewall spacers on sidewalls of the recesses;
    etching away the amorphized material to form an undercut below the dielectric layer below the gate structure;
    epitaxially growing a stressor layer on a surface of the second semiconductor layer in the undercut;
    filling the recesses with a filler material; and
    depositing a doped layer on the filler material to form source and drain regions in the areas for source and drain regions.

13. The method as recited in claim 12, further comprising forming a device having a channel in the first semiconductor layer, wherein stress of the stressor layer provides stress in the channel.

14. The method as recited in claim 12, wherein processing the second semiconductor layer includes implanting ions in the second semiconductor layer to form the amorphized material.

15. The method as recited in claim 14, wherein implanting ions includes implanting at least one of Ge, Si and Xe.

16. The method as recited in claim 12, wherein the doped layer includes raised source/drain regions.

17. The method as recited in claim 12, wherein at least one of the filler material and the doped layer includes stress which is induced to the first semiconductor layer.

18. The method as recited in claim 12, wherein filling the recesses with a filler material includes epitaxially growing the filler material in the recesses.

19. The method as recited in claim 12, wherein depositing a doped layer on the filler material includes:
    epitaxially growing the doped layer to a top surface of the first semiconductor layer; and
    epitaxially growing doped raised portions for the source and drain regions.

20. A semiconductor device, comprising:
    a substrate comprising a dielectric layer formed between a first semiconductor, a dielectric layer, and a second semiconductor layer, said first semiconductor layer being formed directly on the dielectric layer and said dielectric layer being formed directly on the second semiconductor layer;
    a gate structure with side spacers formed on the first semiconductor layer;
    recesses formed below areas for source and drain regions, the recesses being filled with a filler material, the source and drain regions being formed on the filler material in the recesses; and
    a stressor layer formed between the recesses and below the dielectric layer in an undercut formed by removing a portion of the second semiconductor layer, the stressor layer providing stress to the first semiconductor layer where a device channel is formed.

21. The device as recited in claim 20, wherein at least a portion of the source and drain regions provide stress to the channel in the first semiconductor layer.

22. The device as recited in claim 20, wherein the stressor layer includes one of SiGe and SiC.

23. The device as recited in claim 20, wherein the stressor layer is epitaxially grown.

24. The device as recited in claim 20, wherein the source and drain regions include portions raised above a top surface of the first semiconductor layer.

25. The device as recited in claim 24, wherein the raised source and drain regions are silicided.

* * * * *